United States Patent [19]

Lang

[11] Patent Number: 4,567,476
[45] Date of Patent: Jan. 28, 1986

[54] METHOD AND CIRCUIT FOR OPTICAL AND/OR ACOUSTIC INDICATION OF THE CHARGE STATE OF A BATTERY OR A STORAGE BATTERY

[75] Inventor: Gerhard Lang, Altweilnau, Fed. Rep. of Germany

[73] Assignee: Braun Aktiengesellschaft, Kronberg, Fed. Rep. of Germany

[21] Appl. No.: 567,098

[22] Filed: Dec. 30, 1983

[30] Foreign Application Priority Data

Jan. 7, 1983 [DE] Fed. Rep. of Germany ....... 3300284

[51] Int. Cl.$^4$ ............................................. G08B 21/00
[52] U.S. Cl. .................................. 340/636; 340/514; 340/644; 340/530
[58] Field of Search ............... 340/636, 644, 514, 530, 340/648; 320/48; 324/433; 30/45

[56] References Cited

U.S. PATENT DOCUMENTS

| | | | |
|---|---|---|---|
| 4,242,672 | 12/1980 | Gault | 340/636 X |
| 4,413,234 | 11/1983 | Lupoli | 340/636 X |
| 4,488,521 | 12/1984 | Miller et al. | 340/636 X |

FOREIGN PATENT DOCUMENTS

| | | |
|---|---|---|
| 2521462 | 5/1975 | Fed. Rep. of Germany . |
| 149141 | 6/1981 | German Democratic Rep. . |

Primary Examiner—James L. Rowland
Assistant Examiner—Daniel Myer
Attorney, Agent, or Firm—Raymond J. De Vellis

[57] ABSTRACT

The subject of the invention is a circuit for monitoring the charge state of a battery for supplying voltage to an electrical consumer through a mode selector switch which may be switched from an OFF-state for disconnecting the electrical consumer from the battery into an ON-state for connecting the electrical consumer with said battery whereby in said ON-state different modes of operation of said electrical consumer are possible. The charge state of the battery is determined when the mode selector switch is in the ON-state and, when the voltage drops below an adjustable threshold value, an acoustic and/or optical indication is triggered after the electrical consumer is switched off. The circuit in the ON-state consumes only a very slight amount of energy and no additional energy in the OFF-state. In addition to the mode selector switch for switching the electrical consumer on and off, no battery test button or additional battery test position of the mode selector switch is required.

10 Claims, 3 Drawing Figures

METHOD AND CIRCUIT FOR OPTICAL AND/OR ACOUSTIC INDICATION OF THE CHARGE STATE OF A BATTERY OR A STORAGE BATTERY

BACKGROUND OF THE INVENTION

Charge state monitoring circuits and reserve indicator circuits are known for batteries and storage batteries, wherein the charge state of the battery in question, said battery being connectable via a switch to an electrical consumer, is monitored by a reference element, whereby the falling of the battery or storage battery voltage below the voltage level presettable by a reference element triggers an acoustic and/or optical device, indicating to the user of the battery-powered electrical consumer that the charge state of the battery or storage battery necessitates replacement or recharging in the near future. The critical voltage value is set so that the amount of charge still in the battery or storage battery when the indicating device is activated permits operation of the electrical consumer for a given space of time. Such acoustic and/or optical indicating devices are provided especially for example in battery or storage battery powered electrical appliances such as electric shavers, electric toothbrushes, or flash units. A disadvantage of the known circuits is that when the voltage falls below the set reference value, a continuous energy drain from the battery or storage battery occurs to power the indicating device, and that the indicating device is activated only when the appliance switch is turned on, so that the user of the electrical device is frequently not aware of the warning signal when using the device or fails to hear an acoustic signal while the device is operating.

Other known battery testing circuits can comprise a battery test button in addition to the appliance switch which, when actuated, provides an indication of the charge state of the battery, in which the no-load voltage is measured, possibly with the aid of a reference element. One disadvantage of these known battery test circuits is that an additional test button must be provided, necessitating additional manufacturing cost and not always actuated during operation, so that if the button is not actuated and a critical charge state of the battery occurs, the battery can be discharged excessively without the user noticing the charge state of the battery. This also applies to designs in which a special battery test position of the operating mode switch is provided instead of an additional battery test button.

A battery-condition tester for a vehicle having a storage battery and a charger connected with the battery is illustrated and described in U.S. Pat. No. 4,413,234 wherein the tester comprises a pair of light-emitting indicators for indicating a low battery condition as well as a normal battery condition. The indicators are selectively energized through a current control means comprising a reference voltage means and a switch which turns on said light-emitting indicators whenever the charge state of said storage battery drops below a predetermined value or is within a predetermined range. However, the known arrangement is such that at least one indicator is illuminated at all times and thus consumes energy from said storage battery. Furthermore, the known tester fails to provide an indication of the battery condition depending upon the specific load.

Another arrangement is illustrated and described in U.S. Pat. No. 4,242,672 wherein a circuit is described which provides an audable alarm to be given when a battery voltage drops below a certain level indicative of the need to replace the battery. This known arrangement includes a three position control switch which establishes off, on and test modes of operation whereby in the test mode of operation a low voltage monitor serves to monitor the battery voltage and to call an audable alarm when the battery voltage drops below a predetermined critical level. The low voltage monitor includes a zener diode and a resistor connected in series across the battery such that so long as the battery voltage remains above a critical level the zener diode is conductive. Whenever the battery voltage passes through a critical level, the zener diode become less conductive such that the base of a transistor is triggered and by activation of this transistor the audable alarm is activated. The known circuit needs an additional position of the switch in order to monitor the charge state of the battery.

A monitoring means for a combustion engine electric storage battery means is shown and described in U.S. Pat. No. 4,488,521 having an electrical system monitor for sensing the actual voltage across the storage battery and for monitoring the current through the storage battery. The known device comprises a plurality of C-MOS type integrated circuit gates and a plurality of resistance means for monitoring the charge state of the battery and for providing an output signal indicating that the monitored voltage is between two points of reference.

SUMMARY OF THE INVENTION

It is an object of the present invention to provide a circuit for displaying the charge state or charge reserve of a storage battery which reliably indicates that the charge state has dropped below a presettable level following completion of operation of an electrical consumer powered by the storage battery.

It is another object of the present invention to provide a circuit for monitoring the charge state of a storage battery which eliminates the need for an additional test button or test position for a mode selector switch and which causes only a slight current draw and no power draw from a storage battery during operation after the electrical consumer has been actuated.

The present invention provides a circuit for monitoring the charge state of a storage battery for supplying energy to an electrical consumer preferably a direct current motor through a mode selector switch being movable between an OFF-state wherein said electrical consumer is disconnected from said battery and at least one ON-state wherein said electrical consumer is connected with said battery, said circuit comprising a threshold switch an input of which is connected to said battery in the ON-state of said selector switch and the output of which is connected to both a first capacitor and a control input of a trigger switch, an input of said trigger switch being connected to said battery when said mode selector switch is in the OFF-state and an output of said trigger switch being connected to a display device, said threshold switch being applied with the voltage of said battery when said mode selector switch is in the ON-state whereby said threshold switch sets said trigger switch when the voltage of said battery has dropped below a predetermined value, said trigger switch after having been actuated by said threshold switch actuates said display device for a predetermined period when said mode selector switch is in the OFF-state.

The circuit ensures that an optical and/or acoustical indication of the charge state of a storage battery is produced after the electrical consumer is switched off as a functional state of the storage battery during the operation of the electrical consumer. After the electrical consumer is switched off no current is consumed even if the charge state falls below a predetermined value, thus triggering the optical and/or acoustical alarm device.

According to an other aspect of the invention the mode selector switch comprises a first contact strip being connected to said electrical consumer, a second contact strip being connected to said battery, a third contact strip being connected to said trigger switch, a fourth and fifth contact strip being connected each to one input terminal of said threshold switch and a contact which connects either said first, second and fourth contact strip or said first, second and fifth contact strip in the ON-state of said mode selector switch and which connects said second and third contact strip in the OFF-state of said mode selector switch, whereby said fourth and fifth contact strip are assigned to two different modes of operation of said electrical consumer for sensing different threshold values of the voltage of said battery.

In still another aspect of the present invention the threshold switch comprises a first transistor having a collector, an emitter and a base terminal, said collector terminal being connected to said fifth contact strip through a first resistor, said base terminal being connected to an adjustable voltage divider and said emitter terminal being connected to a reference potential, said adjustable voltage divider comprising a first voltage divider resistor which is connected in parallel to said fourth and fifth contact strip, a second voltage divider resistor being connected in series to said first voltage divider resistor and to a third voltage divider resistor, said third voltage divider resistor being connected to one terminal of a potentiometer the other terminal of which is connected to a fourth voltage divider resistor the other terminal of which is connected to said reference potential, whereby the tap of said potentiometer is connected to the base terminal of said first transistor.

According to another aspect of the present invention the trigger switch comprises a second transistor having a collector, a base and an emitter terminal, the collector-emitter-path of said second transistor being connected in series with said display device between said third contact strip of said mode selector switch and said reference potential, said collector of said second transistor being connected to the interconnection between said second and third voltage divider resistor of said adjustable voltage divider through the series connection of a second resistor and a first diode the cathode of which is connected to the collector terminal of said second transistor, the base terminal of said second transistor being connected to the collector terminal of said first transistor through a second diode the cathode terminal of which is connected to the base terminal of said second transistor, the emitter terminal of said second transistor being connected to said reference potential, whereby the series connection of said first capacitor and a third resistor is connected in parallel to the base-collector-path of said second transistor and a fourth resistor is connected in parallel to the base-emitter-path of said second transistor.

Other general and specific objects, advantages and aspects of the the invention will become apparent when reference is made to the following detailed description considered in conjunction with the accompanying drawings.

DETAILED DESCRIPTION OF THE PREFERRED EMBODIMENT

Figure 1:
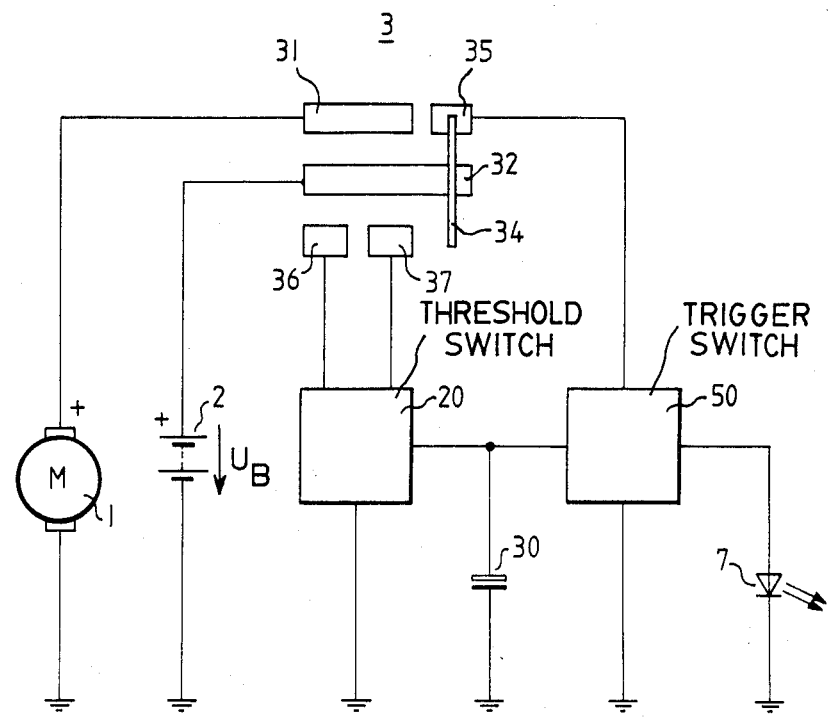
FIG. 1 is a schematic block diagram of a circuit for monitoring the charge state of a storage battery.

The block diagram shown in FIG. 1 shows a dc motor 1 as an electrical consumer, which can be connected via a mode selector switch 3 to a storage battery 2 as a supply voltage source. The mode selector switch 3 comprises a contact 34 and five contact strips 31, 32 and 35 to 37, of which a first contact strip 31 is connected with the dc motor 1. The second contact strip 32 is connected to the storage battery 2, while a third contact strip 35 is connected to the load terminal of a trigger switch 50, whose control input is connected both with a first capacitor 30 and with the output of a threshold switch 20. A fourth contact strip 36 is connected to a first control input of the threshold switch 20 while a fifth contact strip 37 is connected to a second control input of the threshold switch 20. The output of the trigger switch 50 is connected to a light-emitting diode 7 as an optical display device.

In the ON-position, switch contact 34 of the mode selector switch 3 bridges the first, second and fourth contact strips 31, 32 and 36 while in an intermediate position it bridges the first, second and fifth contact strips 31, 32, 37. In the OFF-position the contact 34 bridges the first and third strips 31 and 35, so that in the latter switch position the dc motor 1 is disconnected from the storage battery 2 and there is only one connection to the trigger switch 50 and consequently, when the trigger switch 50 is controlled, to the optical display device 7. The intermediate position of the mode selector switch, in which the first, second and fifth contact strips 31, 32 and 37 are bridged, can be for example a load position for a second mode of operation of the dc motor 1. Thus, when the solution according to the invention is used in an electrical shaver which can be operated independently of the power line, with mode selector switch 3 in the first position, a trimmer is actuated, while with the device in the intermediate position, the trimmer is turned off. In this case, the two switch positions constitute different loads on battery 2. In order for the switching threshold for the indicating device to be adjusted to both types of load, threshold switch 20 delivers different threshold values so that, for example, with the higher load in the first switch position, the switching threshold is set lower.

The operation of the block diagram as shown in FIG. 1 will be described briefly hereinbelow.

With electrical switch 3 in the first ON-position, both the electrical consumer 1 and the first control input of threshold switch 20 are connected to the battery voltage $U_B$. As long as the battery voltage $U_B$ remains above an amount which can be preset in threshold switch 20 with electrical consumer 1 as the load, the electrical threshold switch remains inactive. If the battery voltage $U_B$ drops below the preset voltage under load, the threshold switch 20 will be connected via its first control input and, by connecting switch contact 34 and fourth contact strip 36, will cause charging of the first capacitor 30 and consequently activation of the control circuit to control trigger switch 50. If the set voltage drops too low only briefly as the result of an increased load, for example when a trimmer is switched on, so that the first capacitor 30 is charged via its first control input as the result of the control exercised by threshold switch 20, first capacitor 30 will immediately be discharged again when the threshold voltage plus the set hysteresis voltage is again exceeded.

If threshold switch 20 is set as a result of battery voltage $U_B$ having dropped below the set minimum value, thus charging storage element 30, trigger switch 50 is actuated and causes battery voltage $U_B$ to be applied to the optical display device, i.e. light-emitting diode 7, via the closed connecting strips 31, 35. Of course, an acoustic device can be provided instead of or in addition to the optical display device. The trigger switch can optionally provide intermittent or continuous control over optical indicating device 7, and is controlled until the first capacitor 30 is discharged. When mode selector switch 3 is in the second ON-position, the threshold for the second load case is set lower, whereby the electrical events otherwise take place as in the first ON-position.

As indicated in the above description of the operating principle, the circuit according to the present invention ensures that the optical display operates after completion of the operation of the electrical consumer 1 with a duration determined by the charge in the first capacitor 30, whereby the control circuit draws only a small amount of power from the storage battery 2 during operation and during the indicating function of the device and draws no power at all after the display function is complete.

Figure 2:
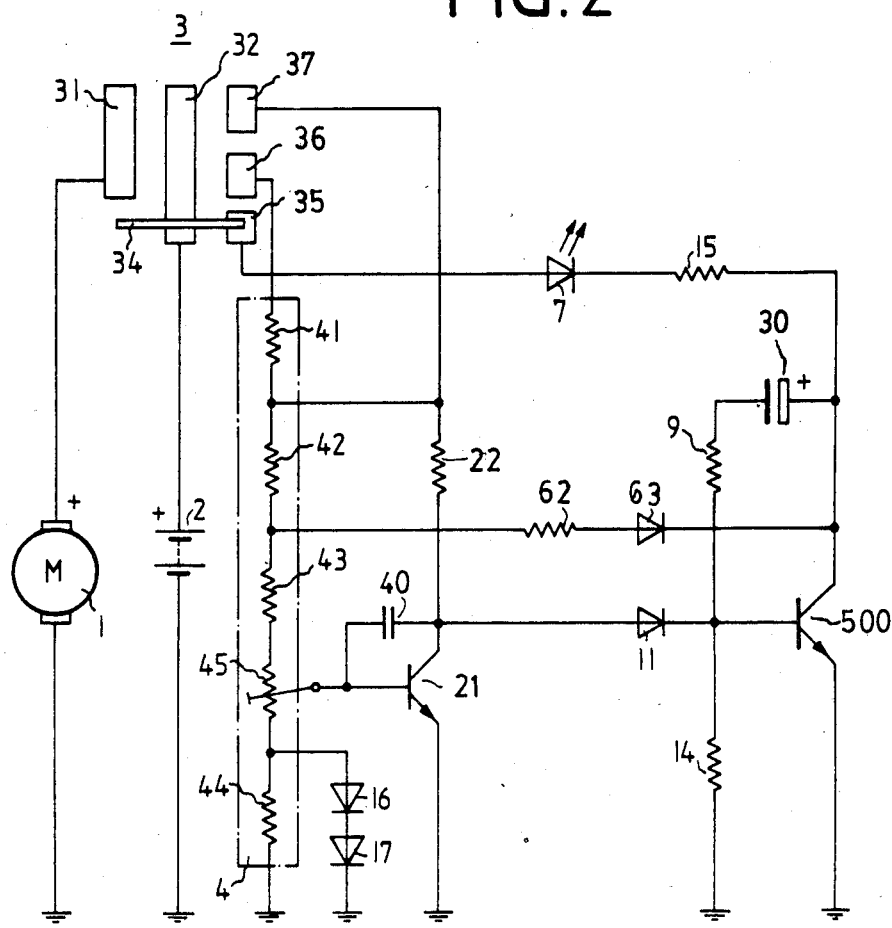
FIG. 2 is a detailed schematic diagram of a modified monitoring circuit.

FIG. 2 is a detailed schematic diagram of a preferred embodiment of the monitoring circuit according to FIG. 1.

The circuit shown in FIG. 2 shows a dc motor 1 as an electrical consumer, said dc motor being supplied from a storage battery 2 via a mode selector switch 3 designed as a slide switch. The mode selector switch 3 comprises five switch contact strips 31, 32, 35, 36 and 37 whereby the first contact strip 31 is connected to one terminal of dc motor 1, the second contact strip 32 is connected to the positive terminal of the storage battery 2, and the third contact strip 35 is connected to the trigger switch for optical and/or acoustic indication of the charge state of the storage battery 2.

The fourth contact strip 36 is connected with a voltage divider 4, composed of four series-connected voltage divider resistors 41, 42, 43 and 44 as well as an adjusting potentiometer 45. The tap of adjusting potentiometer 45 is connected to the base of a first transistor 21 whose collector is connected through a first resistor 22 with the fifth contact strip 37. A direct connection to the fifth contact strip 37 is provided by connection of first voltage divider resistor 41 with second voltage divider resistor 42, such that the first voltage divider resistor 41 bridges the fourth and fifth contact strip 36, 37. The emitter of first transistor 21 is connected directly with ground or reference potential. A filter capacitor 40 is connected in parallel to the base-collector path of first transistor 21, said capacitor reducing the sensitivity of the switching threshold relative to the ripple in battery voltage under motor load.

The collector of first transistor 21 is connected with the anode of a second diode 11, whose cathode is connected to the base of a second transistor 500. The connection of the second voltage divider resistor 42 with the third voltage divider resistor 43 is connected with the series connection of a second resistor 62 with a first diode 63, whose cathode is connected with the collector of second transistor 500. A fourth resistor 14 is provided between the base of second transistor 500 and ground or reference potential. The emitter of second transistor 500, like the emitter of first transistor 21, is connected directly to ground or reference potential.

The anode of a light-emitting diode 7, whose cathode is connected via an eleventh resistor 15 with the collector of second transistor 500, is connected to the third contact strip 35 of mode selector switch 3. A series circuit composed of a first capacitor 30 and a third resistor 9 is connected in parallel with the base-collector path of second transistor 500.

A series circuit composed of a third and fourth diode 16 and 17 is connected in parallel to the fourth voltage divider resistor 44, with fourth diode 17 connected on the cathode side to ground or reference potential. An NTC resistor can be used instead of the series circuit composed of these two diodes or the provision of the NTC resistor instead of the two diodes serves for temperature correction of the switching threshold at the base of first transistor 21.

The mode selector switch 3 further includes a contact 34 which in the OFF-position wipes the second contact strip 32 and the third contact strip 35. In a first ON-position the contact 34 wipes the first contact strip 31, the second contact strip 32 and the fourth contact strip 36. In a second ON-position contact 34 wipes the first, second and fifth contact strip 31, 32, 37.

The function of the circuit according to FIG. 2 described above will be described in greater detail hereinbelow.

When mode selector switch 3 is in the ON-position, i.e. the position in which contact 34 connects first contact strip 31, second contact strip 32, and fourth contact strip 36, the voltage divider 4 is connected in parallel with the storage battery 2. Adjusting potentiometer 45 of voltage divider 4 is used to set a switching threshold for first transistor 21 which is proportional to the storage battery voltage. If the storage battery voltage drops below the set switching threshold, first transistor 21 is blocked. A positive voltage jump at the collector of first transistor 21 controls the base of second transistor 500 through first resistor 22, second diode 11 and fourth resistor 14, causing second transistor 500 to conduct. Consequently the collector of second transistor 500 jumps to ground or reference potential, reduced by the unavoidable emitter-collector voltage drop.

When second transistor 500 becomes conducting, first capacitor 30 which is charged to a positive voltage corresponding to its polarity when second transistor 500 is in the blocked state reverses its polarity to the base voltage of second transistor 500, opposite to the original polarity when second transistor 500 was in the blocked state. When second transistor 500 is in the conducting state, a series circuit composed of second resistor 62 and first diode 63 is connected in parallel to the series circuit composed of third voltage divider resistor 43, adjusting potentiometer 45, and the fourth voltage divider resistor 44. This parallel circuit further reduces the base voltage of first transistor 21 and as a result of the current coupling, reinforces the blocking process of first transistor 21. The reduced base voltage on first transistor 21 causes the latter to reach the switching threshold at which first transistor 21 is controlled only when the primary battery voltage rises. This mode of operation ensures a hysteresis pattern for the switching threshold.

If mode selector switch 3 is then turned off, i.e. switch contact 34 is moved to the OFF-position, in which it contacts only second contact strip 32 and third contact strip 35, light-emitting diode 7 receives positive primary battery voltage. Since second transistor 500 no longer receives a positive voltage at its base terminal second transistor 500 switches off. First capacitor 30 is then recharged via light-emitting diode 7, eleventh resistor 15, third resistor 9 and fourth resistor 14. A positive voltage appears at fourth resistor 14, which controls the base and consequently second transistor 500 which above a certain level switches on. During the recharging process, whose time constant is determined by the product of the capacitance of first capacitor 8 and the resistance of third resistor 9, light-emitting diode 7 receives current via eleventh resistor 15 and the collector-emitter path of second transistor 500, and lights. However, this happens only if the base of second transistor 500 is at a positive potential and second transistor 500 is conducting. If, on the other hand, with mode selector switch 3 in the ON-position, the threshold set on adjusting potentiometer 45 is not reached so that no positive voltage jump acts on the base of second transistor 500, then mode selector switch 3 is subsequently switched to the OFF-position, second transistor 500 remains blocked, first capacitor 30 does not reverse its polarity, and light-emitting diode 7 does not light.

As is clearly evident from the above description of the mode of operation of the circuit according to the invention, light-emitting diode 7 lights up during a specific adjustable time interval after the appliance is switched off, whereby the time span is determined by the time constant of the charging process of first capacitor 30 and consequently by the values of third resistor 9 and first capacitor 30.

If contact 34 of mode selector switch 3 is in the second ON-position, i.e. it connects first contact strip 31, second contact strip 32 and fifth contact strip 37 the battery voltage is directly applied to second voltage divider resistor 42 and the switching threshold set on adjusting potentiometer 45 at the base of first transistor 21 is reached at a lower primary battery voltage.

If a primary battery is inserted or a charged storage battery connected to the circuit according to the invention, light-emitting diode 7 will light up, because the uncharged capacitor 30 will be charged resulting in a current flow through diode 7. After the capacitor is fully charged light-emitting diode 7 goes out, the circuit according to the invention is ready for operation, so that the correct polarity and sufficient contact with the inserted battery can be checked in this fashion.

The threshold value adjustable on adjusting potentiometer 45 for response of the acoustic and/or optical indicating device can be adjusted so that after the preset discharge state of battery 2 is reached, the electrical consumer 1 can still be operated for a certain time at its rated values. This ensures that following acoustic and- /or optical indication of the discharge state reached, operation of the electrical appliance is still possible and the user is reminded in proper time to recharge the storage battery or replace the primary battery.

Variations of the circuit according to the invention are possible such that the discharge state of the battery can be indicated both during operation of the electrical consumer and after the electrical consumer has been switched off. A further embodiment can consist in the sufficient charged state of the battery being displayed optically by a light-emitting diode after the appliance is switched off, i.e. display always takes place even if the predetermined discharge state has not yet been reached.

Although the embodiment has been described with reference to a light-emitting diode for indicating the discharge state of the primary battery, it is readily feasible for an individual skilled in the art to combine an acoustic signalling device instead of light-emitting diode 7, for example a vibrating quartz crystal, or to combine it with an optical light-emitting diode display.

Figure 3:
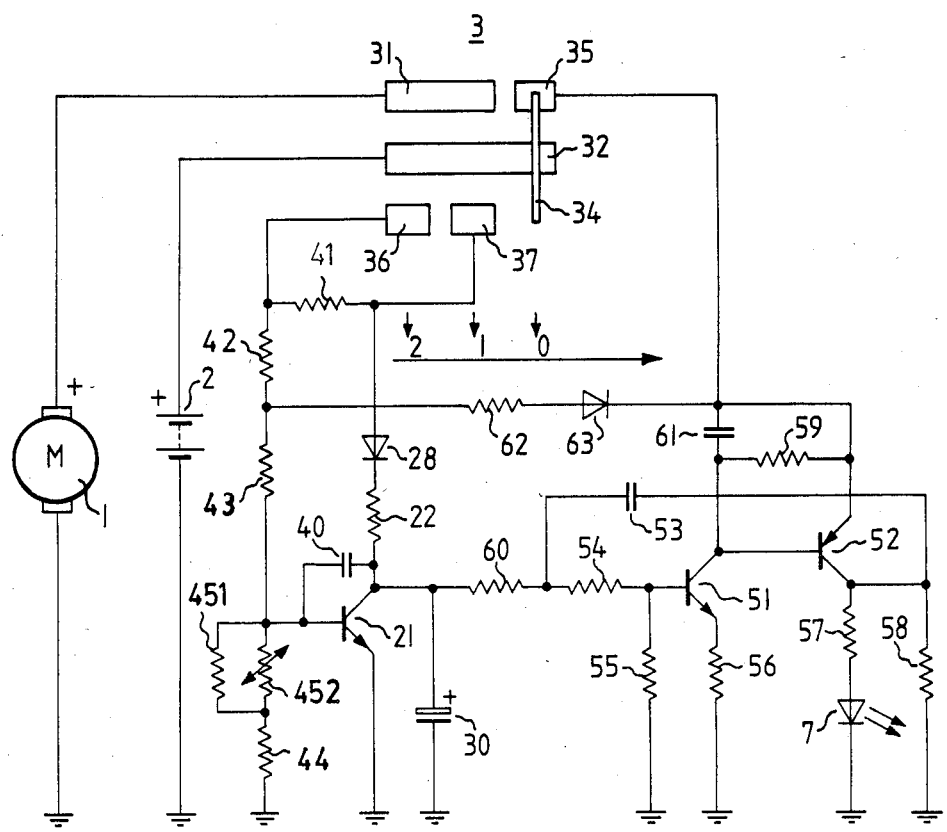
FIG. 3 is a detailed schematic diagram of a monitoring circuit according to FIG. 1.

The detailed diagram of FIG. 3 shows another preferred embodiment of the monitoring circuit according to FIG. 1.

The circuit shown in FIG. 3 for battery reserve indication, by analogy with the representation shown in FIG. 1, shows a dc motor 1 as an electrical consumer, connectable via contact 34 of a mode selector switch 3 to a first contact strip 31 and via a second contact strip 32 to a storage battery 2. Threshold switch 20 according to FIG. 1 comprises a voltage divider with four voltage divider resistors 41, 42, 43, 44 connected in series, of which first voltage divider resistor 41 is connected to fifth contact strip 37 of switch 3 second voltage divider resistor 42 is connected to fourth contact strip 36 and fourth voltage divider resistor 44 is connected to ground or reference potential. An NTC resistor 452 is connected in parallel with a fifth voltage divider resistor 451. The connection of third voltage divider resistor 43 with fifth voltage divider resistor 451 forms a first voltage divider tap, to which the base of a first transistor 21 is connected.

The emitter of first transistor 21 is connected to ground or reference potential, while the collector is connected via a first resistor 22 and a fifth diode 28 to the fifth contact strip 37 of switch 3, whereby the fifth diode 28 is connected on the anode side with seventh contact strip 37. The fourth and fifth contact strips 36, 37 of switch 3 are bridged by first voltage divider resistor 41. In addition, a filter capacitor 40 is connected in parallel with the base-collector lead of first transistor 21, which capacitor can be eliminated if a purely ohmic consumer is used instead of a dc motor 1.

The storage element consists of a first capacitor 30, connected in parallel with the collector-emitter lead of first transistor 21.

The trigger switch is connected via an eigth resistor 60 to the collector of first transistor 21 or one lead of first capacitor 30, and comprises a third transistor 51, whose base is connected both via a fifth resistor 54 to eigth resistor 60 and via a second capacitor 53 to the collector of a fourth transistor 52. The base of third transistor 51 is connected to ground through a twelfth resistor 55 and the emitter of third transistor 51 is connected with ground or reference potential via a seventh resistor 56.

The collector of third transistor 51 is connected on the one hand with the base of fourth transistor 52 and on the other hand via a third capacitor 61 with the third contact strip 35 of switch 3. The collector of fourth transistor 52 is connected via a ninth resistor 57 with the anode of a light-emitting diode 7 as an optical indicating device and via a tenth resistor 58 with ground or reference potential. A sixth resistor 59 is connected in parallel with the base-emitter lead of fourth transistor 52.

Third and fourth transistors 51 and 52 form a complementary Darlington circuit, whereby third transistor 51 is designed as a npn transistor and fourth transistor 52 is designed as a pnp transistor.

The emitter of fourth transistor 52 is connected both directly with the third contact strip 35 of switch 3 and with the cathode of a first diode 63, whose anode is connected via a second resistor 62 to a second voltage divider tap of voltage divider 41, 42, 43, 44, 451 which is formed by the connection of second voltage divider resistor 42 with third voltage divider resistor 43.

The switch positions marked in the drawing shown in FIG. 3 show a first load position of the switch at "2", while switch position "1" indicates a second load position and switch position "0" indicates when switch 3 is in the OFF-position.

The function of the detailed circuit diagram shown in FIG. 3 will be described in greater detail hereinbelow.

By means of voltage divider resistors 41, 42, 43, 44, 451 and NTC resistor 452, depending on whether switch 3, designed in the form of a slide switch, is in position "1" or "2", a voltage threshold is applied to the base of first transistor 21. If the threshold voltage of first transistor 21 drops below the set value as a result of a drop in battery voltage, third transistor 21 becomes blocked and first capacitor 30 is charged by a series circuit composed of fifth diode 28 and first resistor 22. When first capacitor 30 is fully charged, third transistor 51 of the trigger switch is caused to conduct by eigth resistor 60, fifth resistor 54 and twelfth resistor 55.

When third transistor 51 conducts, the complementary Darlington transistor or fourth transistor 52 likewise conducts, the voltage threshold of first transistor 21 is lowered by the series circuit composed of second resistor 62, first diode 63 and tenth resistor 58, to prevent a brief reconnection of first transistor 21, whereby a hysteresis pattern is achieved for first transistor 21.

If mode selector switch 3 is then brought into position "0", a current flows from the positive pole of battery 2 through the switch lead of fourth transistor 52 which is in the conducting state, ninth resistor 57, and light-emitting diode 7 which therefore lights up. A current which branches off from the collector of fourth transistor 52 flows through second capacitor 53, fifth resistor 54, the base emitter lead of third transistor 51, and seventh resistor 56 to ground or reference potential and repolarizes second capacitor 53. This increases the voltage at seventh resistor 56 and reduces the base-emitter voltage of third transistor 51 to the point where third transistor 51 is blocked. Consequently, fourth transistor 52 is blocked as well, causing light-emitting diode 7 to go out.

Second capacitor 53 has its polarity reversed again through first capacitor 30, eigth resistor 60, and tenth resistor 58 to the polarity to which it is exposed. When polarity reversal of second capacitor 53 is complete, third transistor 51, as a result of the voltage applied to first capacitor 30, is triggered again.

When third transistor 51 conducts, fourth transistor 52 likewise conducts and light emitting diode 7 lights up once more. This process repeats itself until first capacitor 30 has been discharged to the point where it can no longer trigger third transistor 51. At this point the light-emitting diode flashes at a frequency which is essentially dependent on the capacity of second capacitor 53, for example a frequency of 3 Hz.

The time for which light-emitting diode 7 flashes can be set as desired by varying the capacitance of first capacitor 30, for example to a duration of 15 seconds.

Third capacitor 61 connected in the lead between the collector of third transistor 51 and third contact strip 35 of switch 3 suppresses the off pulse when contact 34 of switch 3 is moved into the "0" position if the switching threshold of the threshold switch has not yet been reached.

Sixth resistor 59 connected in parallel to the base-emitter lead of fourth transistor 52 keeps fourth transistor 52 reliably blocked after first capacitor 30 is discharged, so that the control circuit draws no current from battery 2 when slide switch 3 is in the "0" or OFF-position. The emitter resistor or seventh resistor 56 operates in a voltage feedback mode with third transistor 51, thus ensuring a constant luminous intensity for light-emitting diode 7.

Filter capacitor 40 connected in parallel with the base-emitter lead of first transistor 21 serves for ac voltage stabilization of the threshold voltage of first transistor 21.

As has already been described hereinabove, the circuit according to the invention ensures that an improper reading as a result of a brief high load, caused for example by the starting current of the dc motor, will be given. The arrangement of fifth diode 28 prevents discharging of first capacitor 30 through voltage divider 41, 42, 43, 44, 451.

Finally, first diode 63 prevents a current draw by the control circuit in switch position "0" via the voltage divider branch formed by third, fourth and fifth voltage divider resistors 43, 44 and 451.

As can be determined from the above description of the function of the circuit for battery reserve indication, the decline in battery voltage during operation with an operating load beneath a presettable threshold value can be determined in a simple and effective manner, stored, and indicated optically and/or acoustically after the operation of electrical consumer 1 terminates. This ensures that a brief drop in battery voltage as the result of a high load will be taken into account when the battery voltage then rises above the set threshold. The control circuit itself operates after electrical consumer 1 is switched off without an additional power draw from battery 2, so that only a current for operating the optical and/or acoustic indicating device is required. The duration and possibly the frequency of the indication can be controlled at will and adjusted to suit the requirements. Depending on the frequency, which can be adjusted by means of second capacitor 53, a constant or intermittent luminous display or, with increasing frequency, an acoustic indication can be produced for example by means of a piezoelectric element.

What is claimed is:

1. A circuit for monitoring the charge state of a storage battery (2) for supplying energy to an electrical consumer preferably a direct current motor (1) through a mode selector switch (3) being movable between an OFF-state wherein said electrical consumer (1) is disconnected from said battery (2) and at least one ON-state wherein said electrical consumer (1) is connected with said battery (2), said circuit comprising a threshold switch (20) an input of which is connected to said battery (2) in the ON-state of said selector switch (3) and the output of which is connected to both a capacitor (30) and a control input of a trigger switch (50), an input of said trigger switch (50) being connected to said battery (2) when said mode selector switch (3) is in the OFF-state and an output of said trigger switch (50) being connected to a display device (7), said threshold switch (20) being applied with the voltage of said battery (2) when said mode selector switch (3) is in the ON-state whereby said threshold switch (20) sets said trigger switch (50) when the voltage of said battery (2) has dropped below a predetermined value, said trigger switch (50) after having been actuated by said threshold switch (20) actuates said display device (7) for a predetermined period when said mode selector switch (3) is in the OFF-state.

2. A circuit according to claim 1, wherein said mode selector switch (3) comprises a first contact strip (31) being connected to said electrical consumer (1), a second contact strip (32) being connected to said battery, a third contact strip (35) being connected to said trigger switch (50), a fourth and fifth contact strip (36, 37) being connected each to one input terminal of said threshold switch (20) and a contact (34) which connects said first, second and fourth contact strip (31, 32, 36) or said first, second and fifth contact strip (31, 32, 37) in the ON-state of said mode selector switch (3) and which connects said second and third contact strip (32, 35) in the OFF-state of said mode selector switch (3), whereby said fourth and fifth contact strips (36, 37) are assigned to two different modes of operation of said electrical consumer (1) for sensing different threshold values of the voltage of said battery (2).

3. A circuit according to claim 2 wherein said threshold switch (20) comprises a first transistor (21) having a collector, an emitter and a base terminal, said collector terminal being connected to said fifth contact strip (37) through a first resistor (22), said base terminal being connected to an adjustable voltage divider (4), and said emitter terminal being connected to a reference potential, said adjustable voltage divider (4) comprising a first voltage divider resistor (41) which is connected in parallel to said fourth and fifth contact strip (36, 37), a second voltage divider resistor (42) being connected in series to said first voltage divider resistor (41) and to a third voltage divider resistor (43), said third voltage divider resistor (43) being connected to one terminal of a potentiometer (45, 451, 452), the other terminal of which is connected to a fourth voltage divider resistor (44), the other terminal of which is connected to said reference potential, whereby the tap of said potentiometer, (45, 451, 452) is connected to the base terminal of said first transistor (21).

4. A circuit according to claim 3 wherein a filter capacitor (40) is connected in parallel with said base terminal and said collector terminal of said first transistor (21).

5. A circuit according to claim 3 wherein said trigger switch (50) comprises a second transistor (500) having a collector, a base and an emitter terminal, the collector-emitter-path of said second transistor (500) being connected in series with said display device (7) between said third contact strip (35) of said mode selector switch (3) and said reference potential, said collector of said second transistor (500) being connected to the interconnection between said second and third voltage divider resistor (42, 43) of said adjustable voltage divider (4) through the series connection of a second resistor (62) and a first diode (63), the cathode of which is connected to the collector terminal of said second transistor (500), the base terminal of said second transistor (500) being connected to the collector terminal of said first transistor (21) through a second diode (11), the cathode terminal of which is connected to the base terminal of said second transistor (500), the emitter terminal of said second transistor (500) being connected to said reference potential, whereby the series connection of said first capacitor (30) and a third resistor (9) is connected in parallel to the base-collector-path of said second transistor (500) and a fourth resistor (14) is connected in parallel to the base-emitter-path of said second transistor.

6. A circuit according to claim 3 wherein said trigger switch (50) comprises a third and fourth transistor (51, 52) in a complementary Darlington circuit, whereby the base of said third transistor (51) is connected via a fifth resistor (60, 54) both with the collector of said first transistor (21) and via a second capacitor (53) with the collector of said fourth transistor (52), the collector of said third transistor (51) being connected with the base of said fourth transistor (52), the emitter of which is connected both with said third contact strip (35) of said mode selector switch (3) and through a sixth resistor (59) with the emitter of said fourth transistor (52), the collector of said fourth transistor (52) being connected to one terminal of the display device (7), the terminal of which is connected to said reference potential.

7. A circuit according to claim 6 wherein the collector of said third transistor (51) is connected via a third capacitor (61) with said third contact strip (35) of said mode selector switch (3).

8. A circuit according to claim 6 wherein the emitter of said fourth transistor (52) is connected to the cathode of a first diode (63) whose anode is connected through a second resistor (62) with the interconnection of said second and third voltage divider resistor (42, 43) of said adjustable voltage divider (4).

9. A circuit according to claim 6 wherein the display device (7) consists of a light-emitting diode whose anode is connected with the collector of said fourth transistor (52) and whose cathode is connected to said reference potential.

10. A circuit according to claim 6 wherein the emitter of said third transistor (51) is connected via a seventh resistor (56) with said reference potential.

* * * * *